(12) United States Patent
Klare et al.

(10) Patent No.: US 7,763,669 B2
(45) Date of Patent: *Jul. 27, 2010

(54) LOW-VISCOSITY, RADIATION-CURABLE FORMULATION FOR PRODUCING ADAPTIVE EARPIECES

(75) Inventors: Martin Klare, Dortmund (DE); Reiner Altman, Castrop-Rauxel (DE); Michael Kutschinski, Castrop-Rauxel (DE); Thomas Veit, Münster (DE)

(73) Assignee: Dreve-Otoplastik GmbH, Unna (DE)

( * ) Notice: Subject to any disclaimer, the term of this patent is extended or adjusted under 35 U.S.C. 154(b) by 221 days.

This patent is subject to a terminal disclaimer.

(21) Appl. No.: 11/664,904

(22) PCT Filed: Oct. 13, 2005

(86) PCT No.: PCT/DE2005/001836

§ 371 (c)(1),
(2), (4) Date: Apr. 6, 2007

(87) PCT Pub. No.: WO2006/042514

PCT Pub. Date: Apr. 27, 2006

(65) Prior Publication Data

US 2008/0287564 A1 Nov. 20, 2008

(30) Foreign Application Priority Data

Oct. 18, 2004 (DE) .................. 10 2004 050 868

(51) Int. Cl.
*C03C 25/10* (2006.01)
*A61K 6/08* (2006.01)
(52) U.S. Cl. .................. 522/96; 522/78; 522/79; 522/121; 522/173; 523/116; 524/100; D24/174

(58) Field of Classification Search .................. 522/173, 522/78–79, 121, 96; 523/116; 524/100; D24/174
See application file for complete search history.

(56) References Cited

U.S. PATENT DOCUMENTS

| 5,985,958 A | * | 11/1999 | Moszner et al. | ............... 524/83 |
| 6,818,725 B2 | * | 11/2004 | Klare et al. | .................. 528/73 |
| 7,232,646 B2 | * | 6/2007 | Klare et al. | ............. 430/285.1 |

OTHER PUBLICATIONS

Urethane dimethacrylate, Esstech Inc., p. 1-2.*
Shanghai Yancui Import and Export Co., Ltd.; Triethylene glycol dimethacrylate; p. 1-3.*
* cited by examiner

*Primary Examiner*—Mark Eashoo
*Assistant Examiner*—Jessica Paul
(74) *Attorney, Agent, or Firm*—Jonathan Myers; Andrew Wilford

(57) ABSTRACT

The invention relates to a biocompatible, low-viscosity, radiation-curable formulation for producing medical products, in particular adaptive ear pieces, otoplastic parts, shells or ear parts, by means of PNP methods or stereolithographic methods. Said formulation comprises: a) 15-60 wt. % of a monomeric or oligomeric dimethacrylate based on bisphenol A or bisphenol F; b) 0-50 wt. % one or more monomeric or oligomeric urethane (meth)acrylates with a functionality n<4, a viscosity <30 Pa s and a molecular weight <3500; c) 2-25 wt. % of a monomeric, aliphatic or cycloaliphatic dimethacrylate with a viscosity <3 Pa s; d) 2-35 wt. % of an iminooxadiazone dion derivative, characterised by 3 methacrylate and/or acrylate functions; 0-15 wt. % one or more monofunctional methacrylates; f) 0.5-6 wt. % of a photo initiator or a combination of photo initiators, whose absorption lies in the wavelength range of the laser beam that is used or the irradiation source; g) 0-0.5 wt. % one or more anaerobic inhibitors; h) 0-40 wt. % fillers with a particle size <25 μm; i) 0-5 wt. % colorants; j) 0-5 wt. % conventional additives such as UV stabilisers or process additives, whereby the sum of the fraction of the components a) to j) totals 100 wt. %.

4 Claims, 6 Drawing Sheets

LOW-VISCOSITY, RADIATION-CURABLE FORMULATION FOR PRODUCING ADAPTIVE EARPIECES

CROSS REFERENCE TO RELATED APPLICATIONS

This application is the US national phase of PCT application PCT/DE2005/001836, filed 13 Oct. 2005, published 27 Apr. 2006 as WO 2006/042514, and claiming the priority of German patent application 102004050868.2 itself filed 18 Oct. 2004.

The invention relates to low-viscosity, radiation-curable formulations for producing medical products, in particular for producing adaptive earpieces, produced by the PNP process (U. Voogdt, "Otoplastik" [Otoplasty], 2nd Edition, Volume 2, Median-Verlag, Killisch-Horn GmbH, p. 22ff. (1998)), or by a regenerative process such as stereolithography, for example, based on at least two compounds containing radically polymerizable (meth)acrylate functions, at least one photoinitiator that is suitable for polymerizing the applicable compounds, at least one inhibitor intended for stabilizing the formulations, and at least one iminooxadiazonedione derivative, characterized by three methacrylate and/or acrylate functions that are suitable for crosslinking the crosslinker monomers/oligomers, among others known from the prior art, as a very advantageous formulation component for such compositions.

In the method referred to as the positive-negative-positive (PNP) process, in a first step the acoustic hearing aid specialist takes an ear impression (positive) for producing an otoplastic part (for devices worn behind the ear) or a shell (for devices worn in the ear). In a second step, molding is used to prepare a negative mold (N) into which the radiation-curable, low-viscosity formulation is poured and then irradiated. The adaptive earpiece (positive) thus produced must be optimally adjusted to the auditory canal. Otherwise, inaccurately fitted earpieces could cause pain (pressure points, for example) and impair the function of the hearing device (feedback, for example). It is therefore important for the formulation to have the lowest possible viscosity, i.e. to be "free-flowing," so that undercuts and very fine surface textures can be filled by the material and thus be formed.

The use of low-viscosity, radiation-curable resins or resin mixtures for producing three-dimensional objects by means of stereolithography is known from U.S. Pat. No. 4,575,330. Furthermore, from U.S. Pat. No. 5,487,012 and WO 2001/087001 it is known that stereolithography may be advantageously used to produce earpieces. In the stereolithographic process, three-dimensional objects are formed from a low-viscosity, radiation-curable formulation in such a way that a thin layer (approximately 0.0025-0.1 mm) of the formulation is precured in a defined manner by actinic radiation so that the produced layer has the desired cross-sectional shape of the object at that location. At the same time, the produced layer is polymerized onto the layer cured in the previous step. The overall structure of the object may be achieved by use of a computerized laser system, such as an Nd:YVO4 solid-state laser (Viper si2 SLA system, 3D Systems, USA). The produced molded body is optionally post-cured, for example by radiation. Special demands are placed on the resin formulations used in the stereolithographic process. These include in particular sensitivity to radiation, viscosity of the resin formulations, and the strength of the molded bodies precured by laser curing. This not yet fully cured molded body is referred to as a "green compact" in the field of stereolithography, and the strength of this green compact, characterized by the modulus of elasticity and the flexural strength, is referred to as "green strength." The green strength represents an important parameter in the practice of stereolithography, since during the stereolithographic process molded bodies with low green strength deform under their own weight, or during the post-curing, using a xenon arc lamp or halogen lamp, for example, may sag or cave in. Taking the above-described demands into account, the use of compositions requiring complex coordination and formulation is therefore understandable. For example, H. Kodama in Rev. Sci. Instrum. 52 (11), 1170-1173 (1981) discloses a low-viscosity, radiation-curable resin formulation composed of an unsaturated polyester, an acrylic acid ester, styrene, and a polymerization initiator. With regard to use in the stereolithographic technique, however, this resin formulation has a low green strength and insufficient photosensitivity.

The resin formulations disclosed in U.S. Pat. No. 4,100,141 likewise have insufficient photosensitivity from a technical production standpoint. In this regard, "low photosensitivity" means that a long time is required for producing the molded bodies. The photosensitivity of the stereolithographic resin formulations must therefore be adjusted in such a way that, as a function of the ratio of the depth penetration of the laser beam into the low-viscosity, radiation-curable resin formulation to the radiation energy applied, at low radiation energy the greatest possible curing depth is realized while at the same time achieving a high rate of polymerization, satisfactory green strength, and sufficient stability of the resin formulation against autopolymerization. Liquid radiation-curable resin formulations which partially satisfy the above-described requirements are described in U.S. Pat. No. 5,476,748 or WO 99/50711, for example. However, these formulations, referred to as hybrid systems, contain a combination of radically and cationically polymerizable components. They are composed of, first, a liquid di- or polyfunctional epoxy compound or a mixture of difunctional or higher-functional epoxy compounds; second, a cationic photoinitiator or a mixture or cationic photoinitiators; third, a photoinitiator or a mixture or photoinitiators for the free radical polymerization; as well as at least one low-viscosity poly(meth)acrylate having a (meth)acrylate functionality of n>2, at least one diacrylate, and a polyol component from the group of hydroxyl-terminated polyethers, polyesters, and polyurethanes. It is known to one skilled in the art that such formulations are viewed critically from a toxicological standpoint, and their use for producing medical products is therefore prohibited or very limited. For example, it is known that cationic photoinitiators may cause skin irritation and allergic reactions. The same applies to compounds containing epoxide functions used in such formulations. It is further known to one skilled in the art that many acrylate compounds, in particular short-chain compounds, likewise have a high allergic potential, and from the biocompatibility standpoint, therefore; resin compositions such as those described in EP 0425441, EP 0914242, and EP 0579503, for example, cannot be used for producing earpieces, for example. Monomeric or oligomeric dimethacrylates based on bisphenol A or bisphenol F and urethane methacrylates having a functionality of $n \geq 2$ have been proven satisfactory for use in the medical field. Compared to the group of acrylate compounds, however, the group of methacrylate compounds has a lower reactivity for the stereolithographic technique. This results in the above-described disadvantages regarding penetration depth of the laser beam and green strength of the precured objects. In addition, higher concentrations of one or more photoinitiators for the free radical polymerization must be used on account of the lower reactivity of this compound class, resulting in reduced stability with regard to autopolymerization of the resin formulation. It is further known to one skilled in the art that in the stereolithographic technique when a large number of low-weight objects having small parts is produced there is increased mechanical and thermal stress on the stereolithographic resin formulation that can result in autopolymerization of the stereolithographic resin or altered properties of the resin composition and the molded bodies produced therefrom. This is attributed, on the one hand, to the fact that when small quantities of resin are used the precured molded bodies fixed on a platform must be removed fairly often from the space inside the stereolithographic unit, resulting in temperature fluctuations of the stereolithographic resin within the space. On the other hand, in the production of earpieces a relatively large surface-to-volume ratio results for the molded bodies produced. It is known to one skilled in the art that in the free radical polymerization an inhibition layer caused by oxygen infiltration remains on the surface of the molded bodies. As a result, during the production process the incompletely grafted or polymerized resin may dissolve from the surface of the test piece and into the stereolithographic resin. Another important point for such formulations is the flexibility of the molded bodies obtained. It is known to one skilled in the art that the commercially available formulations having adequate biocompatibility for the above-described uses are brittle. The average elongation values for cured objects are between 4 and 8% (DIN EN ISO 178). Increased mechanical stress may cause breakage of the produced adaptive earpieces, possibly resulting in sharp-edged fragments. This is undesirable from the standpoint of increased risk of injury. Various strategies, such as the use of monofunctional diluent monomers (JP 97-431498) or the use of monomeric or oligomeric low-viscosity urethane acrylates (DE 41 38 309) have been pursued in order to solve this problem. Materials with increased flexibility can be obtained by use of the referenced components. However, the above-described formulation components result in disadvantages such as increased shrinkage, increased water absorption, and increased allergic potential caused by low-viscosity urethane acrylates. Furthermore, the use of polyether polyols (WO 1997/038354) has been described for reducing the crosslinking density of the three-dimensional polymer network in order to decrease the brittleness of molded bodies. However, the disadvantages of this method include reduced strength and significant reduction of stability against water and moisture in the produced molded bodies. For these reasons, it is clear that in the production of earpieces using the PNP process and the stereolithographic technique, minimization of the viscosity of the radiation-curable resin composition while maintaining the biocompatibility and acceptable chemical-physical and mechanical properties of the produced molded bodies is an important parameter. From a technical production standpoint using stereolithography, it is also desirable to be able to adjust both the penetration depth of the laser beam and the critical energy of the stereolithographic resin formulation corresponding to the application.

The object of the present invention is to provide a resin formulation for the production of medical products, in particular earpieces, using conventional PNP technology or by means of stereolithography that meets the mechanical requirements, in particular an elongation of >10%, the toxicological requirements, and the demands placed on the above-described methods. It has been found that a low-viscosity resin mixture composed of one or more monomeric or oligomeric dimethacrylates that are different from one another and based on bisphenol A or bisphenol F, and containing a urethane (meth)acrylate having a functionality of $n<4$ and a viscosity $>7$ and $<20$ Pa·s, and also containing an iminooxadiazonedione derivative having a functionality of 3 may be used for the PNP process or the stereolithographic technique, resulting in precured molded bodies which are cured by laser and which have a high green strength. Surprisingly, it has also been found that by use of the reaction product of an asymmetrical isocyanate trimer (AST) containing a hydroxy-functional (meth)acrylate, it is possible to produce resin formulations having lower viscosity compared to the symmetrical variant. Furthermore, by use of the combination of the above-described asymmetrical variant and an aliphatic urethane (meth)acrylate, radiation-curable, low-viscosity resin formulations may be obtained whose biocompatibility, chemical-physical properties, and ratio of critical energy to penetration depth of the laser beam may be specifically adjusted to the requirements of the above-described production methods. It has also been found that the laser penetration depth and the critical energy of the resin formulations may be advantageously controlled by adding small quantities of an anaerobic inhibitor such as phenothiazine or DPPH. The molded bodies obtained by curing have, in addition to good mechanical properties, excellent biocompatibility and low water absorption, have elongation to break values $\geqq 10\%$, and may undergo aftertreatment such as grinding or painting.

Figure 1:
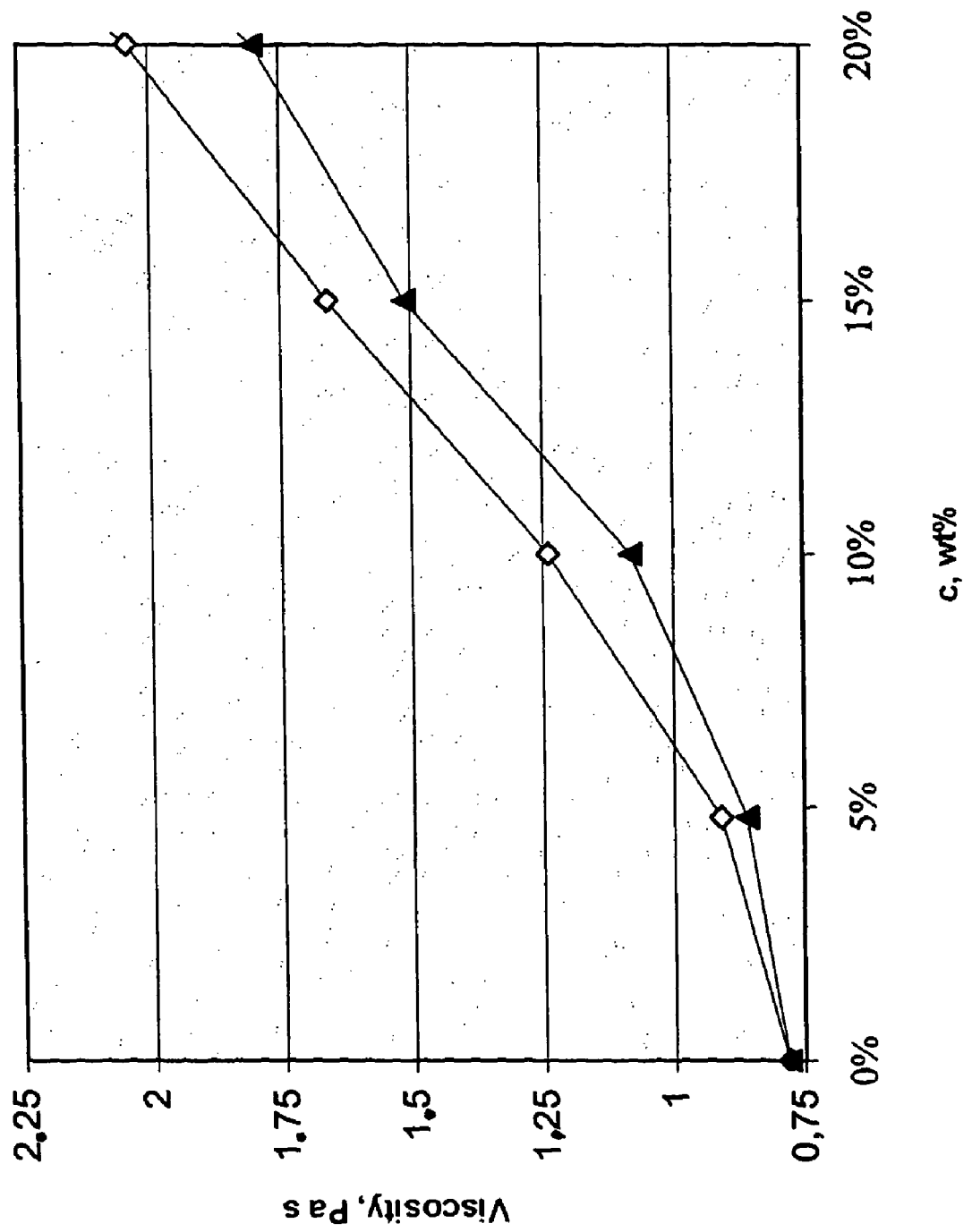
FIG. 1 shows the viscosity of a stereolithographic resin mixture of the symmetrical variant (◇) and the asymmetrical variant (▲) of the reaction product of HEMA with the HDI trimerizate as a function of the concentration of the reaction product.

The subject matter of the present invention, therefore, is a low-viscosity, radiation-curable resin formulation for use in the PNP processor stereolithography, containing a) 15-60% by weight of a monomeric or oligomeric dimethacrylate based on bisphenol A or bisphenol F;

b) 0-50% by weight of one or more monomeric/oligomeric urethane (meth)acrylates having a functionality of $n<4$, a viscosity $<30$ Pa·s, and a molecular weight $<3500$;

c) 2-25% by weight of a monomeric aliphatic or cycloaliphatic dimethacrylate having a viscosity $<3$ Pa·s;

d) 2-35% by weight of an iminooxadiazonedione derivative, characterized by 3 methacrylate and/or acrylate functions;

e) 0-15% by weight of one or more monofunctional methacrylates;

f) 0.5-6% by weight of one photoinitiator or a combination of several photoinitiators whose absorption lies in the wavelength range of the laser beam or irradiation source used;

g) 0-0.5% by weight of one or more anaerobic inhibitors;
h) 0-40% by weight fillers;
i) 0-5% by weight dyes;
j) 0-5% by weight of customary additives such as UV stabilizers or process additives, the sum of the fraction of components a) through j) equaling 100% by weight.

The mixture according to the invention preferably contains
a) 20-50% by weight of an (n)-ethoxylated bisphenol A dimethacrylate having an ethoxylation rate of n<10, or a mixture of (n)-ethoxylated bisphenol A dimethacrylates having an ethoxylation rate of n<0.10;
b) 5-45% by weight of one or more aliphatic or cycloaliphatic monomeric/oligomeric urethane (meth)acrylates having a functionality of n<4, a viscosity <15 Pa·s, and a molecular weight <2000;
c) 3-10% by weight of a monomeric aliphatic or cycloaliphatic dimethacrylate having a viscosity -<3 Pa·s;
d) 3-25% by weight of an iminooxadiazonedione derivative, characterized by 3 methacrylate and/or acrylate functions;
e) 2-15% by weight of one or more monofunctional methacrylates having a viscosity <3 Pa·s;
f) 1-4% by weight of one photoinitiator or a combination of several photoinitiators whose absorption lies in the wavelength range of the laser beam or irradiation source used;
g) 0-0.5% by weight of one anaerobic inhibitor or a combination of anaerobic inhibitors, also in conjunction with aerobic inhibitors known to those skilled in the field of stereolithography;
h) 0-20% by weight fillers;
i) 0-5% by weight dyes;
j) 0.01-3% by weight of customary additives such as UV stabilizers or process additives, the sum of the fraction of components a) through j) equaling 100% by weight.

Examples of compounds suitable as component (a) include dimethacrylates of (n)-alkoxylated bisphenol A, such as bisphenol A ethoxylate (2) dimethacrylate, bisphenol A ethoxylate (4) dimethacrylate, bisphenol A propoxylate (2) dimethacrylate, and bisphenol A propoxylate (4) dimethacrylate, and dimethacrylates of (n)-alkoxylated bisphenol F, such as bisphenol F ethoxylate (2) dimethacrylate, bisphenol F ethoxylate (4) dimethacrylate, bisphenol F propoxylate (2) dimethacrylate, bisphenol F propoxylate (4) dimethacrylate, and mixtures thereof. The use of monomeric or oligomeric dimethacrylates based on bisphenol A, in particular bisphenol A ethoxylate (2) dimethacrylate and bisphenol A ethoxylate (4) dimethacrylate, is preferred. Particularly preferred are mixtures of these two dimethacrylates based on bisphenol A having a proportion of bisphenol A ethoxylate (4) dimethacrylate>bisphenol A ethoxylate (2) dimethacrylate.

The urethane (meth)acrylates having a functionality <4 used as component (b) in the formulations according to the invention are known to one skilled in the art and may be prepared in a known manner, for example by reacting a hydroxyl-terminated polyurethane with methacrylic acid to produce the corresponding urethane methacrylate, or by reacting an isocyanate-terminated prepolymer with hydroxymethacrylates.

Corresponding methods are known from EP 0579503, for example. Urethane (meth)acrylates are also commercially available and are marketed, for example, under the trade names PC-Cure® by Piccadilly Chemicals, CN 1963 by Sartomer, Photomer by Cognis, Ebecryl by UCB, and Genomer® by Rahn. It is preferred to use as urethane (meth) acrylates those having functionalities of n<4, viscosities <15 Pa·s, molecular weights <2000, and which have been prepared from aliphatic starting materials. Used in particular is the isomeric mixture 7,7,9- (or 7,9,9-)trimethyl-4,13-dioxo-3,14-dioxa-5,12-diazahexadecane-1,16-diol dimethacrylate obtained from HEMA and TMDI.

Examples of compounds suitable as component (c) include the following: 1,3-butanediol dimethacrylate, 1,6-hexanediol dimethacrylate, 1,3-butylene glycol dimethacrylate, diethylene glycol dimethacrylate, ethylene glycol dimethacrylate, neopentyl dimethacrylate, polyethylene glycol dimethacrylate, triethylene glycol dimethacrylate, and tetraethylene glycol dimethacrylate, preferably 1,4-butanediol dimethacrylate. Such products are commercially available, for example from Sartomer.

Figure 2:
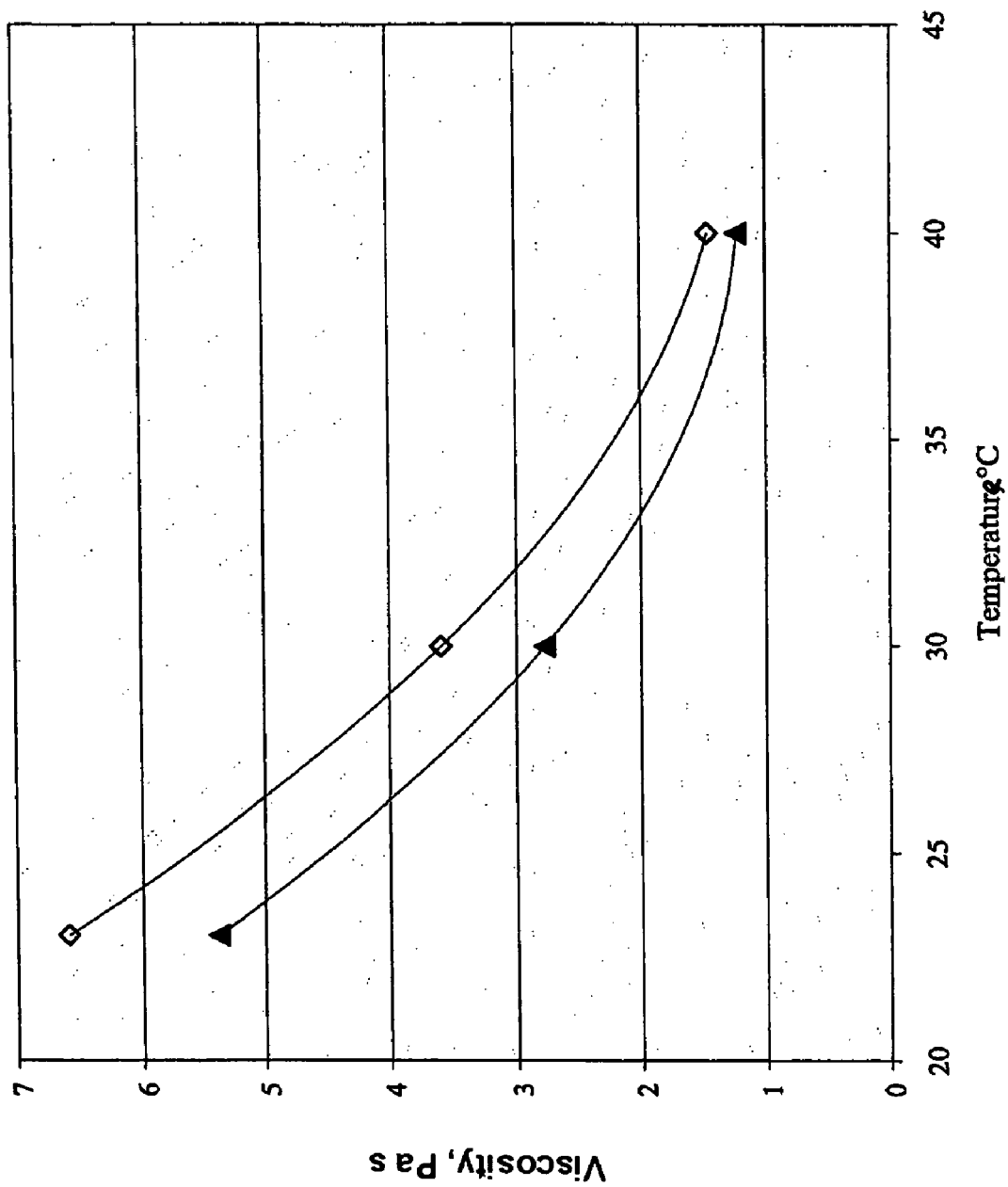
FIG. 2 shows the viscosity of a stereolithographic resin mixture of 30% by weight of the symmetrical variant (◇) and the asymmetrical variant (▲) of the reaction product of HEMA with the HDI trimerizate as a function of the concentration of the reaction product.

Examples of compounds suitable as component (d) include the reaction product of an asymmetrically trimerized aliphatic isocyanate with a hydroxyl group-containing methacrylate such as 2-hydroxyethyl methacrylate, for example. Such products are commercially available, for example from Rahn. The asymmetrical variants are characterized by a lower viscosity compared to the symmetrical variants. The differences in viscosity between the symmetrical and asymmetrical variants of the reaction product of an HDI trimerizate with 2-hydroxyethyl methacrylate in the resin formulation from Example 1 are illustrated in FIGS. 1 and 2. It is clearly seen that the iminooxadiazindione derivative has a significantly lower viscosity compared to the symmetrical variant. The differences in viscosities of the variants also become greater with increasing temperature. For use in resin formulations employed in the PNP process and in stereolithographic methods, the lowest possible viscosity is sought for the above-described reasons of molded body precision. In addition, the time required to produce a molded body in the stereolithographic process depends, among other factors, on the wiper speed. The wiper speed increases with decreasing viscosity. A low viscosity is therefore advantageous with regard to the shortest possible production times and thus high cost-efficiency of the stereolithographic process.

EXAMPLE 1

| Amount | Component |
|---|---|
| $29.1 * (1 - x/100)\%$ by wt. | Aliphatic urethane acrylate oligomer (viscosity <15 Pa · s and molecular wt. >1500) |
| $28.8 * (1 - x/100)\%$ by wt. | Bisphenol A ethoxylate (4) dimethacrylate |
| $13.6 * (1 - x/100)\%$ by wt. | Aliphatic urethane triacrylate |
| $11.2 * (1 - x/100)\%$ by wt. | Bisphenol A ethoxylate (2) dimethacrylate |
| $6.1 * (1 - x/100)\%$ by wt. | Tetrahydrofurfuryl methacrylate |
| $6.1 * (1 - x/100)\%$ by wt. | Triethylene glycol dimethacrylate |
| x % by wt. | Asymmetrical or symmetrical variants of the reaction product of 2-hydroxyethyl methacrylate with the symmetrical or asymmetrical HDI trimerizate |
| $3.5 * (1 - x/100)\%$ by wt. | 7,7,9- (or 7,9,9-)trimethyl-4,13-dioxo-3,14-dioxa-5,12-diazahexadecane-1,16-diol dimethacrylate |
| $1.2 * (1 - x/100)\%$ by wt. | 2,4,6-Trimethylbenzoyldiphenylphosphine oxide |
| $0.4 * (1 - x/100)\%$ by wt. | Bis(2,4,6-trimethylbenzoyl)phenyl-phosphine oxide |

FIG. 1 shows the viscosity of a stereolithographic resin mixture of the symmetrical variant (◇) and the asymmetrical variant (▲) of the reaction product of HEMA with the HDI trimerizate as a function of the concentration of the reaction product. FIG. 2 shows the viscosity of a stereolithographic resin mixture of 30% by weight of the symmetrical variant (◇) and the asymmetrical variant (▲) of the reaction product of HEMA with the HDI trimerizate as a function of temperature.

The formulations according to the invention may contain, for example, the following compounds as component (e): allyl methacrylate, methyl, ethyl, n-propyl, n-butyl, isobutyl, n-hexyl, 2-ethylhexyl, n-octyl, n-decyl, n-dodecyl, isobornyl, isodecyl, lauryl, and stearyl methacrylate, 2-hydroxyethyl and 2- and 3-hydroxypropyl methacrylate, tetrahydrofurfuryl methacrylate, and cyclohexyl methacrylate. Tetrahydrofurfuryl methacrylate is particularly preferred.

Any type of photoinitiator that forms free radicals upon corresponding radiation may be used as component (f). These include the known photoinitiator compounds of benzoins and benzoin ethers such as benzoin, benzoin methyl ether, benzoin ethyl ether, benzoin isopropyl ether, benzoin phenyl ether, and benzoin acetate, acetophenones such as acetophenone, 2,2-dimethoxyacetophenone, and 1,1-dichloroacetophenone, benzil and benzil ketals such as benzildimethyl ketal and benzildiethyl ketal, anthraquinones such as 2-methylanthraquinone, 2-ethylanthraquinone, 2-tert-butylanthraquinone, 1-chloroanthraquinone, and 2-amylanthraquinone, triphenylphosphine, benzoylphosphine oxides such as 2,4,6-trimethylbenzoyldiphenylphosphine oxide (Luzirin TPO) and bis(2,4,6-trimethylbenzoylphenyl)phosphine oxide, benzophenones such as benzophenone and 4,4'-bis(N,N'-dimethylamino)benzophenone, thioxanthones and xanthones, acridine derivatives, phenazine derivatives, quinoxaline derivatives, or 1-phenyl-1,2-propanedione-2-O-benzoyl oxime, 1-aminophenyl ketones or 1-hydroxyphenyl ketones such as 1-hydroxycyclohexylphenyl ketone, phenyl-(1-hydroxyisopropyl)ketone, and 4-isopropylphenyl-(1-hydroxyisopropyl)ketone. Particularly preferred compounds used in combination with an Nd:YVO4 solid-state laser are bis(2,4,6-trimethylbenzoyl)phenylphosphine oxide, 2,4,6-trimethylbenzoyldiphenylphosphine oxide, 2-hydroxy-2-methylpropiophenone, hydroxycyclohexylphenyl ketone, and mixtures of these photoinitiators.

As anaerobic inhibitors or stabilizers, phenothiazine (PTZ), 2,2-diphenyl-1-picrylhydrazyl radical (DPPH), or a combination of the inhibitors may be added to the mixtures according to the invention for adjusting the laser penetration depth and the critical energy.

The influence of the concentration of phenothiazine (PTZ) and 2,2-diphenyl-1-picrylhydrazyl radical (DPPH) in the formulations of Examples 1 and 2 on the penetration depth of the laser beam and the critical energy is illustrated in FIGS. 3 through 6. The laser penetration depth and the critical energy were determined using the windowpane method described by P. F. Jacobs and D. T. Reid in Rapid Prototyping & Manufacturing, Society of Manufacturing Engineers, Dearborn, Mich., 1992, 1st Ed., pp. 263-280. It is seen from the figures that addition of even small quantities of phenothiazine (PTZ) and 2,2-diphenyl-1-picrylhydrazyl radical (DPPH) results in a sharp, essentially linear increase in the critical energy and a linear decrease in the penetration depth of the laser beam. This influence of the inhibitors phenothiazine (PTZ) and 2,2-diphenyl-1-picrylhydrazyl radical (DPPH) on the is relevant parameter Ec (critical energy, mJ·cm$^{-2}$) and Dp (laser penetration depth, mils) for the stereolithographic resin differs from the influence of the inhibitors, such as p-methoxyphenol, added to the stereolithographic resins corresponding to the prior art (L. E. Levy, J. Polym. Sci., Part A, Polym. Chem. 30 (1992), 569ff). For example, in comparison to p-methoxyphenol the parameters Ec and Dp may be linearly adjusted in a wider range by small concentrations of the inhibitors. This is of great advantage, particularly for the production of such resins and adjustment of the above-described parameters. From a technical production standpoint this may be used to adjust the laser penetration depth that has a direct influence on the accuracy of the production process. For example, performing curing over a value of laser penetration depth that exceeds the desired layer thickness for the process reduces the resolution of the process. High values of the laser penetration depth play an important role in particular for transparent stereolithographic resins that preferably are used for producing otoplastic parts. In the case of stereolithographic resins in the medical field, however, in particular stereolithographic resins for the production of the above-described adaptive earpieces, the accuracy of the production, and thus, the fit, of the molded body is of paramount importance.

EXAMPLE 2

| | |
|---|---|
| 27.4 * (1 − x/100)% by wt. | Aliphatic urethane acrylate oligomer (viscosity <15 Pa · s and molecular wt. >1500) |
| 27.2 * (1 − x/100)% by wt. | Bisphenol A ethoxylate (4) dimethacrylate |
| 12.8 * (1 − x/100)% by wt. | Aliphatic urethane triacrylate |
| 10.5 * (1 − x/100)% by wt. | Bisphenol A ethoxylate (2) dimethacrylate |
| 5.7 * (1 − x/100)% by wt. | Tetrahydrofurfuryl methacrylate |
| 5.7 * (1 − x/100)% by wt. | Triethylene glycol dimethacrylate |
| 4.7 * (1 − x/100)% by wt. | Asymmetrical variant of the reaction product of 2-hydroxyethyl methacrylate with the HDI trimerizate |
| 3.3 * (1 − x/100)% by wt. | 7,7,9- (or 7,9,9-)trimethyl-4,13-dioxo-3,14-dioxa-5,12-diazahexadecane-1,16-diol dimethacrylate |
| 1.1 * (1 − x/100)% by wt. | 2,4,6-Trimethylbenzoyldiphenylphosphine oxide |
| 0.4 * (1 − x/100)% by wt. | Bis(2,4,6-trimethylbenzoyl)phenylphosphine oxide |
| x % by wt. | Anaerobic inhibitor |

As anaerobic inhibitors, phenothiazine (FIGS. 3 and 4) was used in concentrations of x=0; 0.025; 0.05; 0.1; and 0.15% by weight, and 2,2-diphenyl-1-picrylhydrazyl radical (DPPH) (FIGS. 5 and 6) was used in concentrations of x=0.0; 0.01; 0.025; and 0.05% by weight.

Figure 3:
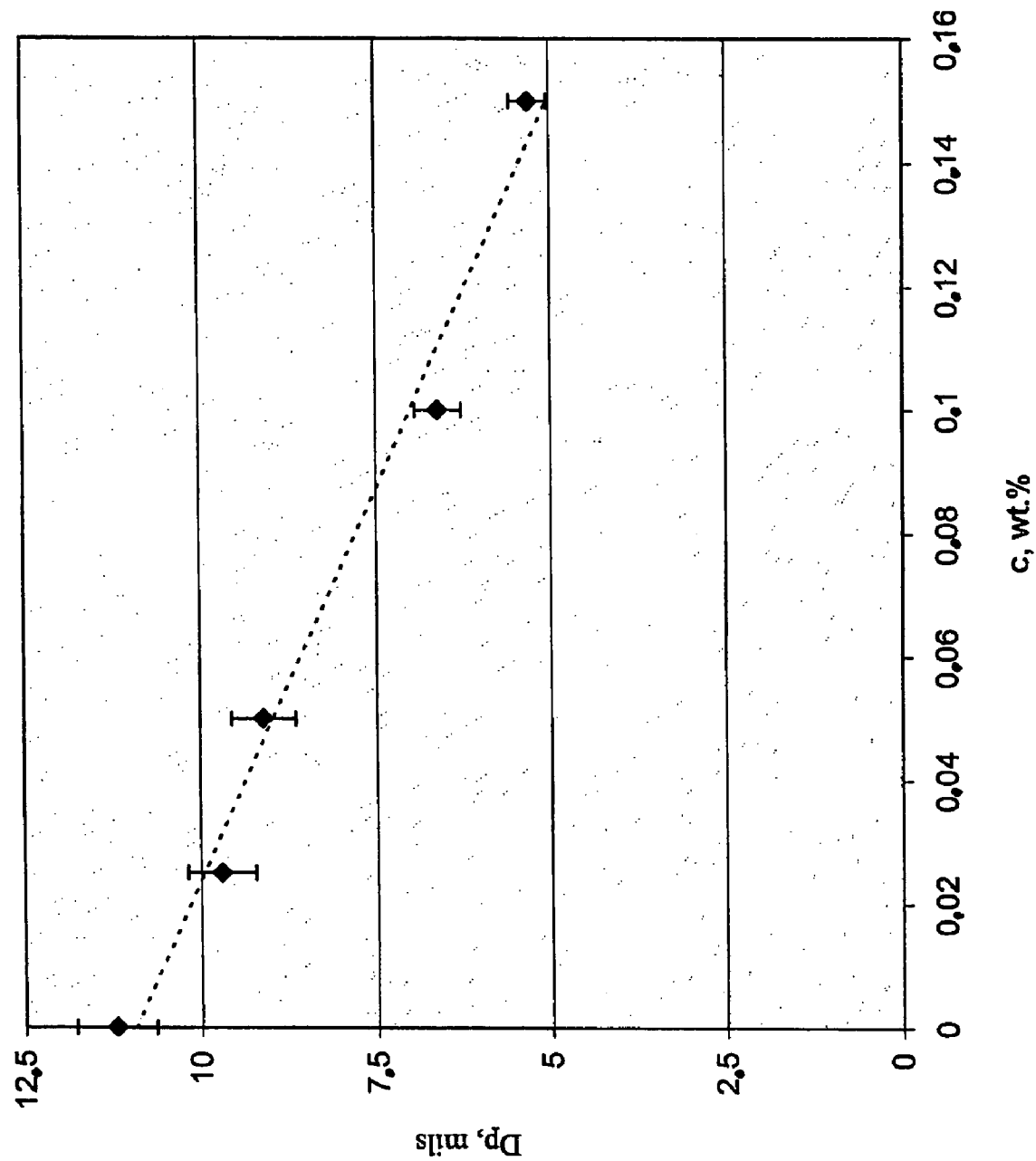
FIG. 3 shows the influence of the concentration of phenothiazine on the laser penetration depth Dp of the resin formulations from Example 2.

FIG. 3 shows the influence of the concentration of phenothiazine on the laser penetration depth Dp of the resin formulations from Example 2.

Figure 4:
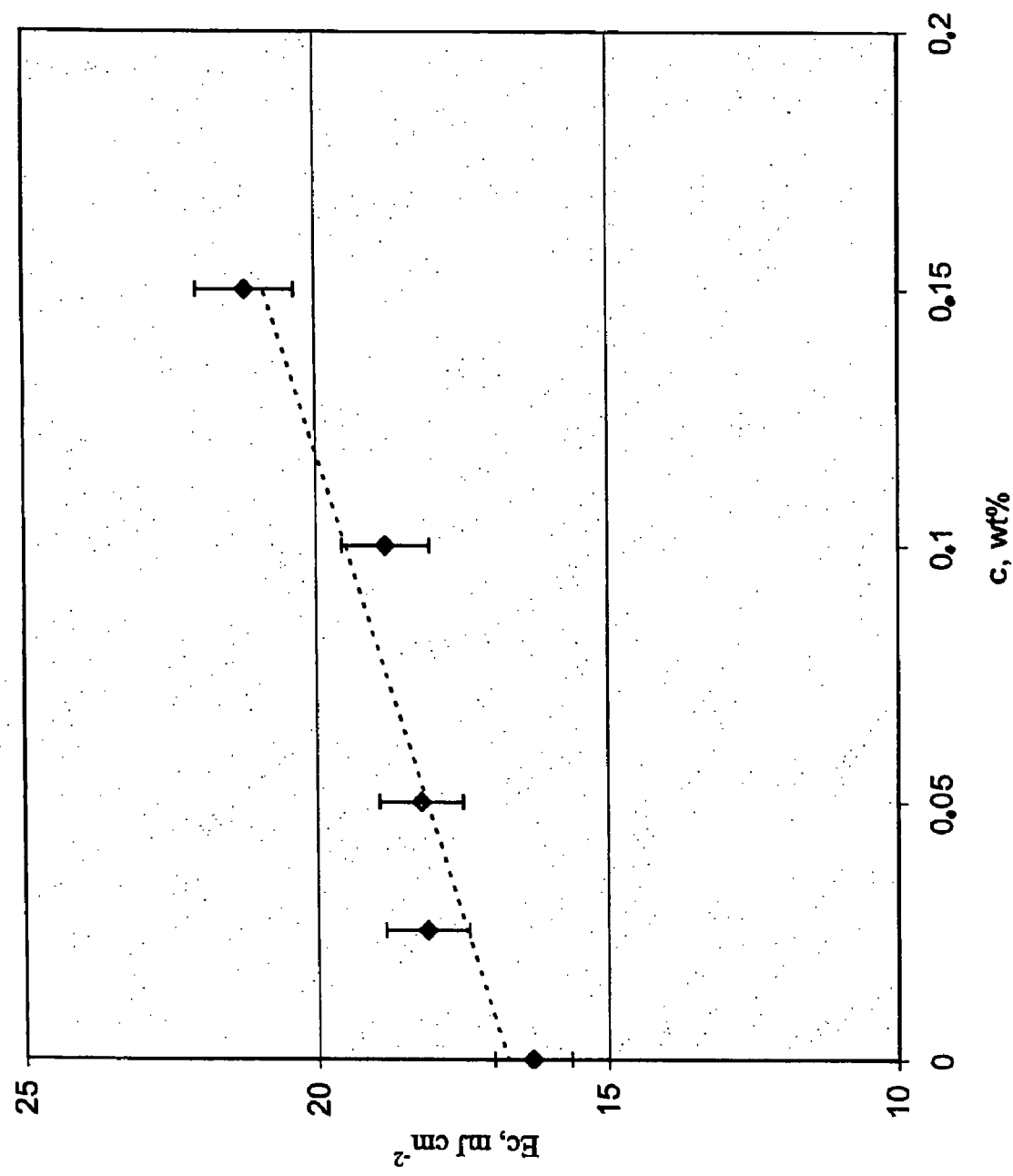
FIG. 4 shows the influence of the concentration of phenothiazine on the critical energy Ec of the resin formulations from Example 2.

FIG. 4 shows the influence of the concentration of phenothiazine on the critical energy Ec of the resin formulations from Example 2.

Figure 5:
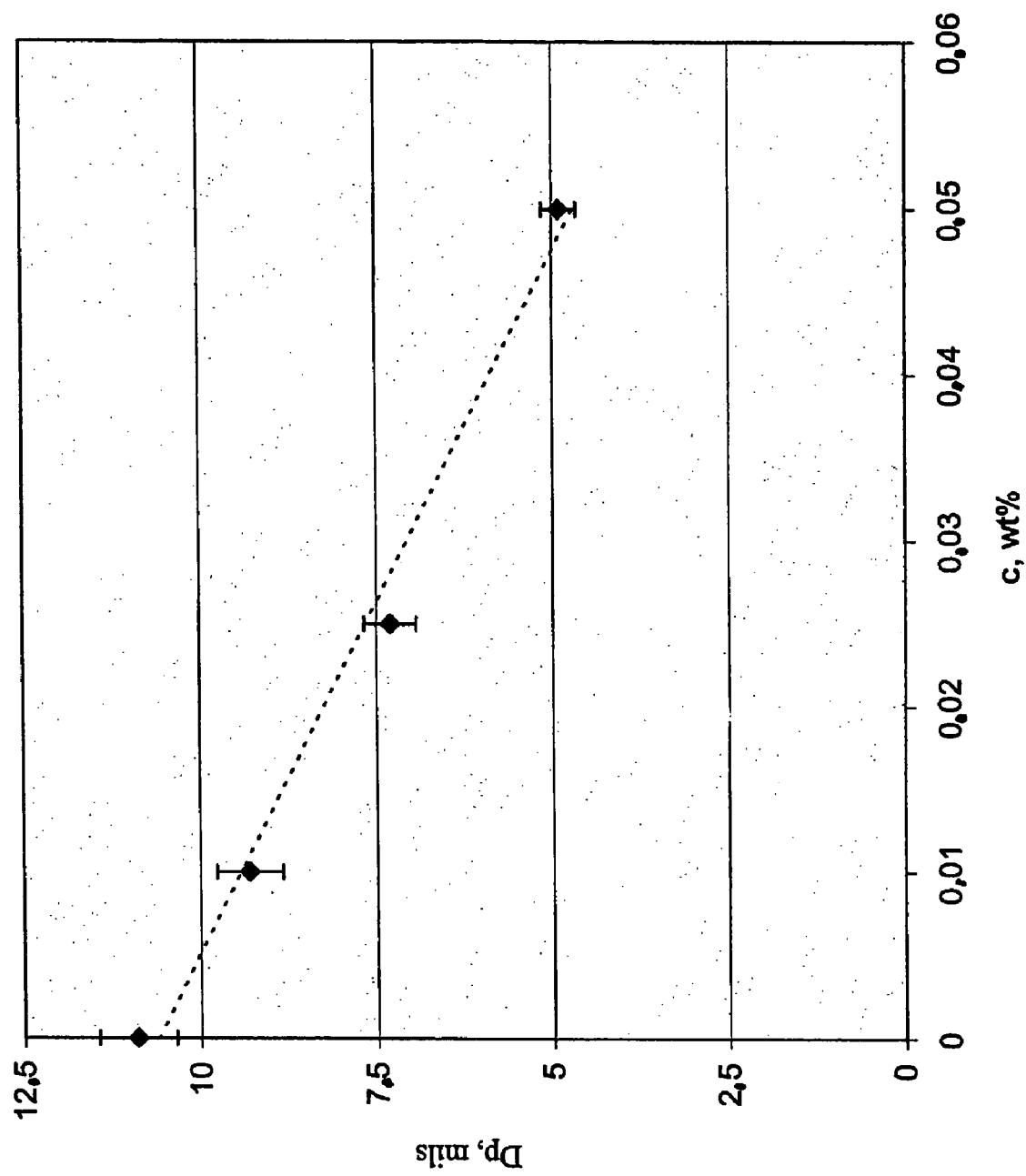
FIG. 5 shows the influence of the concentration of DPPH on the laser penetration depth Dp of the resin formulations from Example 2.

FIG. 5 shows the influence of the concentration of DPPH on the laser penetration depth Dp of the resin formulations from Example 2.

Figure 6:
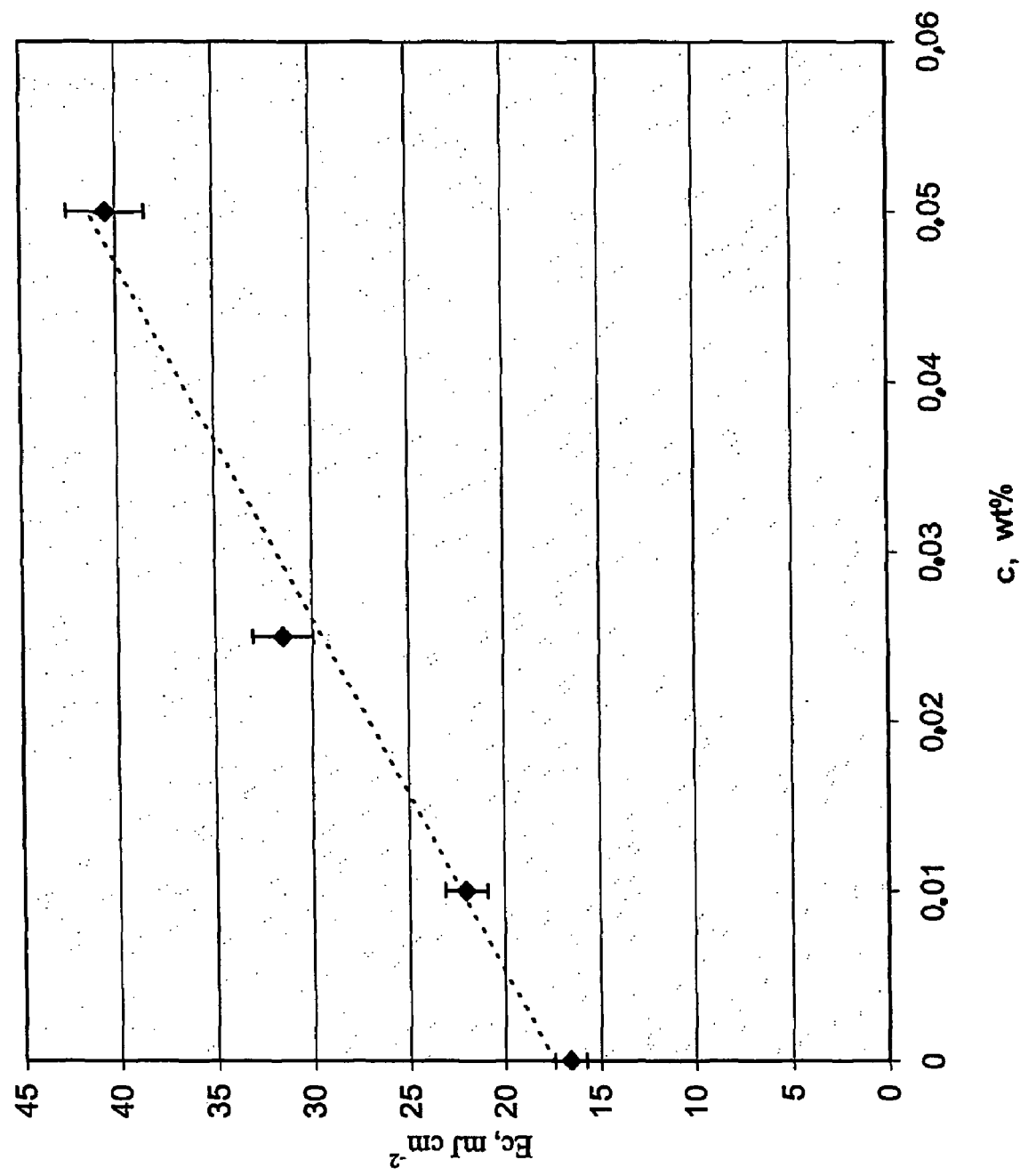
FIG. 6 shows the influence of the concentration of DPPH on the critical energy Ec of the resin formulations from Example 2.

FIG. 6 shows the influence of the concentration of DPPH on the critical energy Ec of the resin formulations from Example 2.

Table 1 shows the influence of the inhibitor concentration on the mechanical values of the resin formulation from Example 2.

The influence of anaerobic inhibitors on the mechanical properties of the molded bodies is shown in Table 1. The flexural strength, modulus of elasticity, and elongation were determined in accordance with EN ISO 178 (1996), using a Zwick 1 test unit from Zwick. The test pieces were post-cured for 2×7 min, using the PCU stroboscope irradiation unit from Dreve. Table 1 shows that, particularly when the anaerobic inhibitor phenothiazine is added, resin formulations are obtained which are superior to those of the prior art with regard to their overall mechanical values (see Tables 3 and 4).

Additives known to one skilled in the art may be added, if necessary, to the mixtures according to the invention, and include leveling agents, UV stabilizers, wetting agents, fillers, dyes, and pigments. In the sense of the invention, anthraquinone dye preparations such as Macrolex®, available from Bayer, are particularly suitable as dyes.

Application Examples

EXAMPLE 3

For a Yellowish, Opaque Stereolithographic Resin

| | |
|---|---|
| 27.3% by wt. | Aliphatic urethane acrylate oligomer (viscosity <15 Pa·s and molecular wt. >1500) |
| 27.1% by wt. | Bisphenol A ethoxylate (4) dimethacrylate |
| 12.8% by wt. | Aliphatic urethane triacrylate |
| 10.6% by wt. | Bisphenol A ethoxylate (2) dimethacrylate |
| 5.7% by wt. | Tetrahydrofurfuryl methacrylate |
| 5.7% by wt. | Triethylene glycol dimethacrylate |
| 4.7% by wt. | Asymmetrical variant of the reaction product of 2-hydroxyethyl methacrylate with the HDI trimerizate |
| 3.4% by wt. | 7,7,9- (or 7,9,9-)trimethyl-4,13-dioxo-3,14-dioxa-5,12-diazahexadecane-1,16-diol dimethacrylate |
| 1.1% by wt. | 2,4,6-Trimethylbenzoyldiphenylphosphine oxide |
| 0.8% by wt. | Pyrogenic silicic acid (primary particle size <16 nm) |
| 0.4% by wt. | Bis(2,4,6-trimethylbenzoyl)phenylphosphine oxide |
| 0.4% by wt. | Iron oxide pigment |

EXAMPLE 4

For a Transparent Blue Stereolithographic Resin

| | |
|---|---|
| 27.67% by wt. | Aliphatic urethane acrylate oligomer (viscosity <15 Pa·s and molecular wt. >1500) |
| 27.5% by wt. | Bisphenol A ethoxylate (4) dimethacrylate |
| 13.0% by wt. | Aliphatic urethane triacrylate |
| 10.7% by wt. | Bisphenol A ethoxylate (2) dimethacrylate |
| 5.7% by wt. | Tetrahydrofurfuryl methacrylate |
| 5.7% by wt. | Triethylene glycol dimethacrylate |
| 4.8% by wt. | Asymmetrical variant of the reaction product of 2-hydroxyethyl methacrylate with the HDI trimerizate |
| 3.4% by wt. | 7,7,9- (or 7,9,9-)trimethyl-4,13-dioxo-3,14-dioxa-5,12-diazahexadecane-1,16-diol dimethacrylate |
| 1.1% by wt. | 2,4,6-Trimethylbenzoyldiphenylphosphine oxide |
| 0.4% by wt. | Bis(2,4,6-trimethylbenzoyl)phenylphosphine oxide |
| 0.03% by wt. | Anthraquinone dye preparation (including C. I. Solvent Blue 97) |

EXAMPLE 5

For a Transparent Red Stereolithographic Resin

| | |
|---|---|
| 27.69% by wt. | Aliphatic urethane acrylate oligomer (viscosity <15 Pa·s and molecular wt. >1500) |
| 27.5% by wt. | Bisphenol A ethoxylate (4) dimethacrylate |
| 13.0% by wt. | Aliphatic urethane triacrylate |
| 10.7% by wt. | Bisphenol A ethoxylate (2) dimethacrylate |
| 5.7% by wt. | Tetrahydrofurfuryl methacrylate |
| 5.7% by wt. | Triethylene glycol dimethacrylate |
| 4.8% by wt. | Asymmetrical variant of the reaction product of 2-hydroxyethyl methacrylate with the HDI trimerizate |
| 3.4% by wt. | 7,7,9- (or 7,9,9-)trimethyl-4,13-dioxo-3,14-dioxa-5,12-diazahexadecane-1,16-diol dimethacrylate |
| 1.1% by wt. | 2,4,6-Trimethylbenzoyldiphenylphosphine oxide |
| 0.4% by wt. | Bis(2,4,6-trimethylbenzoyl)phenylphosphine oxide |
| 0.01% by wt. | Red H azo dye |

EXAMPLE 6

For a Clear Transparent Resin Formulation for the Stereolithographic Process

| | |
|---|---|
| 27.7% by wt. | Aliphatic urethane acrylate oligomer (viscosity <15 Pa·s and molecular wt. >1500) |
| 27.5% by wt. | Bisphenol A ethoxylate (4) dimethacrylate |
| 13.0% by wt. | Aliphatic urethane triacrylate |
| 10.7% by wt. | Bisphenol A ethoxylate (2) dimethacrylate |
| 5.7% by wt. | Tetrahydrofurfuryl methacrylate |
| 5.7% by wt. | Triethylene glycol dimethacrylate |
| 4.8% by wt. | Asymmetrical variant of the reaction product of 2-hydroxyethyl methacrylate with the HDI trimerizate |
| 3.4% by wt. | 7,7,9- (or 7,9,9-)trimethyl-4,13-dioxo-3,14-dioxa-5,12-diazahexadecane-1,16-diol dimethacrylate |
| 1.1% by wt. | 2,4,6-Trimethylbenzoyldiphenylphosphine oxide |
| 0.4% by wt. | Bis(2,4,6-trimethylbenzoyl)phenylphosphine oxide |

EXAMPLE 7

For a Clear Transparent Resin Formulation for the PNP Process

| | |
|---|---|
| 25.84% by wt. | Bisphenol A ethoxylate (4) dimethacrylate |
| 18.3% by wt. | Aliphatic urethane acrylate oligomer (viscosity <15 Pa·s and molecular wt. >1500) |
| 15.0% by wt. | 50% solution of nanoparticles (<50 nm) in hexariediol diacrylate |
| 11.6% by wt. | Aliphatic urethane triacrylate |
| 9.3% by wt. | Bisphenol A ethoxylate (2) dimethacrylate |
| 5.7% by wt. | Tetrahydrofurfuryl methacrylate |
| 5.7% by wt. | Triethylene glycol dimethacrylate |
| 4.7% by wt. | Asymmetrical variant of the reaction product of 2-hydroxyethyl methacrylate with the HDI trimerizate |
| 3.3% by wt. | 7,7,9- (or 7,9,9-)trimethyl-4,13-dioxo-3,14-dioxa-5,12-diazahexadecane-1,16-diol dimethacrylate |
| 0.5% by wt. | 2,4,6-Trimethylbenzoyldiphenylphosphine oxide |
| 0.06% by wt. | UV stabilizer |

Table 2 lists the parameters for the above-described resins that are relevant for the stereolithographic process. All viscosity measurements were performed at 23° C. using a CVO rheometer from Bohlin Instruments. The flexural strength, modulus of elasticity, and elongation were determined in accordance with EN ISO 178 (1996), using a Zwick 1 test unit from Zwick. For determining the Ec and Dp values using the above-described windowpane method, in each case the average values were determined for 10 windowpane test pieces. The test pieces were produced using a Viper si2 SLA system (3D Systems) equipped with a Nd:YVO4 solid-state laser. The green compacts were post-cured for 2×7 min, using the Fototec PCU stroboscope irradiation unit from Dreve.

Studies were also performed on the cytotoxic potential of the formulation, using cured test pieces of stereolithographic resin formulations from Example 3.

In the test series for determining the biological reaction of the mammalian cell culture (L929) to the test pieces, elution tests were performed in accordance with ISO 10993-5 (1999), ISO 10993-12 (2002), and ISO 17025 (1999). No biological reactivity (Class 0) was observed for the L929 mammalian cells. Consequently, the above-described material is not cytotoxic and meets the specifications of ISO 10993-5.

Based on these results, it is clear that the stereolithographic resin formulations according to the invention may be used in the medical field, in particular for the production of earpieces. Table 3 lists the mechanical and chemical parameters of the commercially available stereolithographic resins LLS71410 from Vantico and Fototec SL (transparent red) from Dreve that are designed for medical use. The table shows that; compared to the resin formulation from Vantico, the formulations according to the invention advantageously have significantly lower viscosity and higher flexural strength and modulus of elasticity. Compared to the Fototec SL material from Dreve, the elongation to break of the disclosed formulations is significantly higher than the values for the commercially available product. It has also been found that, although the material from Vantico is not classified as cytotoxic, in test series for determination of cytotoxicity a slight biological reaction was induced corresponding to Class 1. With regard to use in the medical field, this is advantageously not the case for the formulations according to the invention.

From a technical production standpoint, all inventive stereolithographic resin formulations from Examples 3 through 7 have ideal viscosities <2000 mPa·s.

Compared to the materials used in the conventional technique (PNP process) for producing earpieces (for example, Fotoplast® from Dreve Otoplastik GmbH—see Table 4), the mechanical values for flexural strength and modulus of elasticity of the cured molded bodies are significantly higher for the formulation disclosed in Example 7.

Table 2 lists the parameters for the stereolithographic resin formulations from Examples 3 through 7.

Table 3 lists the data for commercially available stereolithographic resins.

Table 4 lists the mechanical values for commercially available products for producing earpieces.

TABLE 1

| Inhibitor | Concentration, % by wt. | Modulus of elasticity, N · mm$^{-2}$ | Flexural strength, N · mm$^{-2}$ | Elongation to break, % |
|---|---|---|---|---|
| — | — | 1762 | 89 | 9 |
| Phenothiazine | 0.025 | 1867 | 95 | 15 |
| Phenothiazine | 0.05 | 1989 | 95 | 13 |
| Phenothiazine | 0.10 | 2007 | 101 | 12 |
| Phenothiazine | 0.15 | 1832 | 89 | 10 |
| DPPH | 0.01 | 1452 | 61 | 13 |
| DPPH | 0.025 | 1324 | 69 | 11 |
| DPPH | 0.05 | 1277 | 66 | 10 |

TABLE 2

| Property | Example 3 | Example 4 | Example 5 | Example 6 | Example 7 |
|---|---|---|---|---|---|
| Viscosity at 23° C., mPa s | 1700 | 1800 | 1800 | 1800 | 1590 |
| Modulus of elasticity of the cured molded body, N · mm$^{-2}$ | 2107 | 2010 | 1926 | 1966 | 2227 |
| Flexural strength of the cured molded body, N · mm$^{-2}$ | 103 | 105 | 103 | 104 | 114 |
| Elongation to break of the cured molded body, N · mm$^{-2}$ | 13 | 11 | 11 | 12 | 11 |
| Ec, mJ · cm$^{-2}$ | 13.0 | 12.5 | 13.2 | 12.1 | Not rptd. |
| Dp, mils | 5.1 | 9.5 | 9.4 | 9.8 | Not rptd. |

TABLE 3

| Property | Fototec SL (transparent red) stereolithographic | LLS71410 stereolithographic |
|---|---|---|
| Viscosity at 23° C., mPa s | 820 | 2350 |
| Modulus of elasticity, N · mm$^{-2}$ | 2004 | 1612 |
| Flexural strength, N · mm$^{-2}$ | 98 | 81 |
| Elongation to break, N · mm$^{-2}$ | 7 | 12 |
| Ec, mJ · cm$^{-2}$ | 4.6 | 3.4 |
| Dp, mils | 15 | 6.6 |

TABLE 4

| Material | Modulus of elasticity, N · mm$^{-2}$ | Flexural strength, N · mm$^{-2}$ | Elongation to break, N · mm$^{-2}$ |
|---|---|---|---|
| Fotoplast S/IO, transparent blue, | 1513 | 81 | 10 |
| Fotoplast S/IO, transparent red, | 1527 | 84 | 13 |
| Fotoplast S/IO, transparent | 1602 | 88 | 11 |
| Fotoplast S/IO, yellowish, Lot 301515 | 1586 | 80 | 13 |

Note:

Iminooxadiazonedione derivatives are understood to mean compounds of the formula given below in which R1 through R3 stand for a C1-C16 alkyl, a C1-C16 cycloalkyl, and/or a C1-C16 alkylcycloalkyl radical, at least one of the R1 through R3 radicals being functionalized with at least one or more ethylenically unsaturated double bonds. The term "ethylenically unsaturated" means that at least one polymerizable carbon-carbon double bond is present which may be mono-, di-, or trisubstituted.

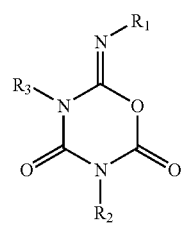

The invention claimed is:

1. A biocompatible, radiation-curable formulation having a viscosity <2000 mPa·s for the production of earpieces, using PNP or by stereolithographic processes, containing:
   a) 20-50% by weight of an (n)-ethoxylated bisphenol A dimethacrylate having an ethoxylation rate of n<10, or a mixture of (n)-ethoxylated bisphenol A dimethacrylates having an ethoxylation rate of n<10;
   b) 5-45% by weight of one or more aliphatic or cycloaliphatic monomeric/oligomeric urethane (meth) acrylates having a functionality of n<4, a viscosity <15 Pa·s, and a molecular weight <2000;
   c) 3-10% by weight of a monomeric aliphatic or cycloaliphatic dimethacrylate having a viscosity <3 Pa·s;

d) 3-25% by weight of the asymmetric iminooxadiazonedione compound of the Formula (I)

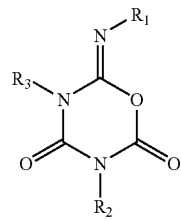

wherein $R_1$, $R_2$ and $R_3$ are each $C_1$ to $C_{16}$ alkyl, cycloalkyl, or $C_1$ to $C_{16}$ alkyl-cycloalkyl, wherein each of the groups $R_1$, $R_2$ and $R_3$ is functionalized with methacrylate or acrylate functional groups;
  e) 2-15% by weight of one or more monofunctional methacrylates having a viscosity <3 Pa·s;
  f) 1-4% by weight of one photoinitiator or a combination of several photoinitiators whose absorption lies in the wavelength range of the laser beam or irradiation source used wherein the photoinitiator or combination of photoinitiators is selected from the group consisting of bis (2,4,6-trimethylbenzoyl)phenylphosphine oxide, 2,4,6-trimethylbenzoyldiphenylphosphine oxide, and mixtures thereof;
  g) an effective amount up to 0.5% by weight of one anaerobic inhibitor or a combination of anaerobic inhibitors, selected from the group consisting of phenothiazine, DPPH and mixtures thereof;
  h) 0-20% by weight fillers having a particle size <80 nm;
  i) 0-5% by weight dyes;
  j) 0.01-3% by weight of customary additives such as UV stabilizers or process additives, the sum of the fraction of components a) through j) equaling 100% by weight.

2. The formulation according to claim 1 wherein the asymmetric iminooxadiazonedione is the reaction product of 2-hydroxyethyl methacrylate and the asymmetric trimer of hexamethylenediisocyanate.

3. A method for producing an otoplastic medical product, selected from the group consisting of adaptive earpieces, otoplastic parts, shells for hearing devices worn in the ear, or earpieces, which comprises the steps of:
  (i) taking a positive impression of a patient's ear for producing the otoplastic medical product;
  (ii) preparing a negative mold corresponding to the positive impression of the patient's ear;
  (iii) pouring into the negative mold prepared according to step (b) a biocompatible, radiation-curable formulation having a viscosity <2000 mPa·s for the production of earpieces, using PNP or by stereolithographic processes, containing:
    a) 20-50% by weight of an (n)-ethoxylated bisphenol A dimethacrylate having an ethoxylation rate of n<10, or a mixture of (n)-ethoxylated bisphenol A dimethacrylates having an ethoxylation rate of n<10;
    b) 5-45% by weight of one or more aliphatic or cycloaliphatic monomeric/oligomeric urethane (meth) acrylates having a functionality of n<4, a viscosity <15 Pa·s, and a molecular weight <2000;
    c) 3-10% by weight of a monomeric aliphatic or cycloaliphatic dimethacrylate having a viscosity <3 Pa·s;
    d) 3-25% by weight of the asymmetric iminooxadiazonedione compound of the Formula (I)

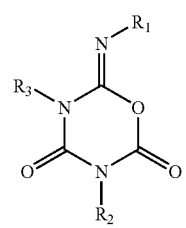

wherein $R_1$, $R_2$ and $R_3$ are each $C_1$ to $C_{16}$ alkyl, cycloalkyl, or $C_1$ to $C_{16}$ alkyl-cycloalkyl, wherein each of the groups $R_1$, $R_2$ and $R_3$ is functionalized with methacrylate or acrylate functional groups;
    e) 2-15% by weight of one or more monofunctional methacrylates having a viscosity <3 Pa·s;
    f) 1-4% by weight of one photoinitiator or a combination of several photoinitiators whose absorption lies in the wavelength range of the laser beam or irradiation source used wherein the photoinitiator or combination of photoinitiators is selected from the group consisting of bis (2,4,6-trimethylbenzoyl)phenylphosphine oxide, 2,4,6-trimethylbenzoyldiphenylphosphine oxide, and mixtures thereof;
    g) an effective amount up to 0.5% by weight of one anaerobic inhibitor or a combination of anaerobic inhibitors, selected from the group consisting of phenothiazine, DPPH and mixtures thereof;
    h) 0-20% by weight fillers having a particle size <80 nm;
    i) 0-5% by weight dyes;
    j) 0.01-3% by weight of customary additives such as UV stabilizers or process additives, the sum of the fraction of components a) through j) equaling 100% by weight; and
  (iv) irradiating the molded otoplastic medical product.

4. The method for producing an otoplastic medical product defined in claim 3 wherein according to step (iii) the asymmetric iminooxadiazonedione is the reaction product of 2-hydroxyethyl methacrylate and the asymmetric trimer of hexamethylenediisocyanate.

* * * * *